(12) United States Patent
Waldfried et al.

(10) Patent No.: US 7,678,682 B2
(45) Date of Patent: Mar. 16, 2010

(54) ULTRAVIOLET ASSISTED PORE SEALING OF POROUS LOW K DIELECTRIC FILMS

(75) Inventors: Carlo Waldfried, Falls Church, VA (US); Orlando Escorcia, Falls Church, VA (US); Ivan Berry, Ellicott City, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 421 days.

(21) Appl. No.: 10/987,276

(22) Filed: Nov. 12, 2004

(65) Prior Publication Data
US 2006/0105566 A1 May 18, 2006

(51) Int. Cl.
*H01L 21/8238* (2006.01)
*H01L 21/76* (2006.01)
*H01L 21/4763* (2006.01)

(52) U.S. Cl. .................. 438/622; 438/201; 438/411; 438/619

(58) Field of Classification Search ............ None
See application file for complete search history.

(56) References Cited

U.S. PATENT DOCUMENTS

| | | | |
|---|---|---|---|
| 6,500,770 B1 | 12/2002 | Cheng et al. | |
| 6,653,358 B2 | 11/2003 | Bruza et al. | |
| 6,759,325 B2 | 7/2004 | Raaijmakers et al. | |
| 6,984,581 B2 * | 1/2006 | Wong | 438/623 |
| 2002/0005583 A1 * | 1/2002 | Harada et al. | 257/758 |
| 2003/0143839 A1 | 7/2003 | Raaijmakers et al. | |
| 2003/0181035 A1 * | 9/2003 | Yoon et al. | 438/653 |
| 2004/0207084 A1 * | 10/2004 | Hedrick et al. | 257/751 |
| 2004/0214427 A1 * | 10/2004 | Kloster et al. | 438/637 |
| 2005/0133920 A1 * | 6/2005 | Liou et al. | 257/758 |
| 2005/0181593 A1 * | 8/2005 | Leu et al. | 438/619 |
| 2005/0245063 A1 * | 11/2005 | Chinthakindi et al. | 438/618 |
| 2006/0024976 A1 * | 2/2006 | Waldfried et al. | 438/778 |

OTHER PUBLICATIONS

Web article entitled "Ferro-Ceramic Grinding Inc. machines over 15 different materials, Silicon Nitride" by Ferro Ceramic, http://www.ferroceramic.com/silicon_nitride.htm, dated Feb. 21, 2008, pp. 2.

(Continued)

*Primary Examiner*—Matthew C Landau
*Assistant Examiner*—James M Mitchell
(74) *Attorney, Agent, or Firm*—Cantor Colburn LLP

(57) ABSTRACT

Processes for sealing porous low k dielectric film generally comprises exposing the porous surface of the porous low k dielectric film to ultraviolet (UV) radiation at intensities, times, wavelengths and in an atmosphere effective to seal the porous dielectric surface by means of carbonization, oxidation, and/or film densification. The surface of the surface of the porous low k material is sealed to a depth less than or equal to about 20 nanometers, wherein the surface is substantially free of pores after the UV exposure.

20 Claims, 2 Drawing Sheets

OTHER PUBLICATIONS

Web article entitled "Silicon Carbide (SiC)—Material Information", by GoodFellow, http://www.goodfellow.com/csp/active/static/E/Silicon_Carbide_HTML, dated Jan. 31, 2008, pp. 2.

Web article entitled "Properties of SiO2 and Si3N4 at 300K", by Siliconfareast.com, http://www.siliconfareast.com/sio2se3n4.htm, dated Jan. 31, 2008, pp. 2.

Web article entitled "Wafer Fab: Glassivation", by Siliconfareast.com, http://www.siliconfareast.com/glassivation.htm, dated Jan. 31, 2008, pp. 2.

Web Article entitled "Low-K" by Wikipedia, http://en.wikipedia.org.wiki/Low-k, dated Mar. 10, 2008, pp. 2.

* cited by examiner

ULTRAVIOLET ASSISTED PORE SEALING OF POROUS LOW K DIELECTRIC FILMS

BACKGROUND

The present disclosure generally relates to the manufacture of semiconductor devices, and more particularly, to an ultraviolet assisted pore sealing process for porous low k dielectric materials employed in semiconductor devices.

As semiconductor and other microelectronic devices progressively decrease in size, the demands placed on device components continue to increase. For example, the prevention of capacitive crosstalk between interconnect lines becomes significantly more important with smaller devices. Capacitive crosstalk is generally a function of both the distance between conductors and the dielectric constant (k) of the material placed in between the conductors. Considerable attention has been focused on electrically isolating the conductors from each other using new insulators having low dielectric constants because although silica ($SiO_2$), which has traditionally been used in such devices because of its relatively good electrical and mechanical properties, however as devices scale to smaller dimensions dielectric constants below $SiO_2$'s value of about 4 are required. These new low k (i.e., a dielectric constant less than 4) materials are desirable for use, for example, as inter-layer dielectrics (ILD).

To achieve low dielectric constants, one can either use a material that possesses a low dielectric constant, and/or introduces porosity into the material, which effectively lowers the dielectric constant because the dielectric constant of air is nominally 1. Porosity has been introduced in low k materials through a variety of means. In the case of spin-on low k dielectrics, a lowering of the k value can be achieved by using high boiling point solvents, by using templates or by porogen based methods. However, the integration of porous low-k materials in the manufacture of the semiconductor device, in general, has proven difficult.

For example, because of the open nature of the porous low k dielectric materials, process gases and chemistries employed in subsequent processing (i.e., after formation of the porous low k dielectric material)) may diffuse into the porous network where they become trapped where they can cause damage as well as alter the dielectric constant. Moreover, pores in direct communication with the surface can cause pinholes to form in subsequent layers deposited and/or formed thereon, e.g., barrier layers.

Accordingly, there is a need in the art to provide improved methods towards porous low k dielectric materials for integration into semiconductor devices. Because of at least the problems noted with the prior art, it would be desirable to seal the porous low k dielectric prior to depositing additional layers and/or prior to further processing. Sealing the surface of the porous low k dielectric will advantageously prevent penetration (and trapping) of process gases and chemistries. Moreover, sealing will provide a continuous surface layer for coating/depositing additional layers thereon. Consequently, pinhole formation in subsequent layers can be substantially prevented.

BRIEF SUMMARY

Disclosed herein are processes for ultraviolet assisted pore sealing of porous low k dielectric materials. In one embodiment, a process for sealing a porous low k dielectric material disposed on a substrate comprises exposing a surface of the porous low k dielectric material to an ultraviolet radiation pattern for a period of time, intensity and wavelength effective to seal the surface of the porous low k material to a depth less than or equal to about 20 nanometers, wherein the surface is substantially free of pores.

In another embodiment, a process for forming an electrical interconnect structure comprises patterning a porous low k dielectric material disposed on a substrate; exposing the porous low k dielectric film to ultraviolet radiation for a period of time, intensity and wavelength pattern effective to seal the surface of the porous low k material to a depth less than or equal to about 20 nanometers, wherein the surface is substantially free of pores; and depositing a barrier layer and/or a conductive layer onto the patterned porous low k dielectric material.

In another embodiment, a process for sealing a porous low k dielectric material disposed on a substrate, comprises oxidizing a surface of the porous low k dielectric material by exposing the surface to an ultraviolet radiation pattern for a period of time, intensity and wavelength effective in an atmosphere comprising oxygen to seal the surface of the porous low k material to a depth less than or equal to about 20 nanometers.

In yet another embodiment, a process for sealing a porous low k dielectric material disposed on a substrate comprises carbonizing a surface of the porous low k dielectric material by exposing the surface to an ultraviolet radiation pattern for a period of time, intensity and wavelength effective to seal the surface of the porous low k material to a depth less than or equal to about 20 nanometers.

In still another embodiment, a process for sealing a porous low k dielectric material disposed on a substrate comprises densifying a surface of the porous low k dielectric material by exposing the surface to an ultraviolet radiation pattern for a period of time, intensity and wavelength effective to seal the surface of the porous low k material to a depth less than or equal to about 20 nanometers.

In another embodiment, a process for sealing the pores of a dielectric material deposited on a substrate comprising exposure of the substrate with ultra-violet radiation to alter the surface bonds to enable bonding site for a subsequent material to be applied which would then seal the pores.

In another embodiment, a process for sealing the pores of a dielectric material deposited on a substrate comprising exposure of the substrate with ultra-violet radiation in the presence of an oxidizing or reducing atmosphere to alter the surface bonds to enable bonding site for a subsequent material to be applied which would then seal the pores.

In yet another embodiment, a multi-step process for sealing the pores of a dielectric material deposited on a substrate comprising exposure of the dielectric material with ultraviolet radiation with or without the presence of an oxidizing or reducing atmosphere to alter the surface bonds followed by the deposition of a sealing material which selectively reacts to the bonds formed by the UV process which then seals the pores.

In yet another embodiment, a multi-step process for sealing the pores of a dielectric material deposited on a substrate, comprising exposure of the dielectric material with a sealant material or sealant precursor and then exposing the substrate with ultra-violet radiation with or without the presence of an oxidizing or reducing atmosphere to react the sealant with the substrate and/or to alter the bonding structure of the sealing material, which then seals the pores.

In yet another embodiment, a process for sealing the pores of a dielectric material deposited on a substrate comprising the exposure of the dielectric material with a sealant material while exposing the substrate with ultra-violet radiation with or without the presence of an oxidizing or reducing atmosphere, where the ultra-violet radiation reacts with the sealant, with the substrate and/or both, which then seals the pores.

The above described and other features are exemplified by the following figures and detailed description.

BRIEF DESCRIPTION OF THE DRAWINGS

Referring now to the figures, which are exemplary embodiments and wherein like elements are numbered alike.

DETAILED DESCRIPTION

The present disclosure is generally directed to a process for sealing porous low k dielectric films. The process generally comprises exposing the porous surface of the porous low k dielectric film to ultraviolet (UV) radiation at intensities, times, wavelengths and in an atmosphere effective to seal the porous dielectric surface by means of carbonization, oxidation, film densification, generation of surface reactive sites that enable the chemical reaction of a deposited material which then seals the pores, by deposition of a material that when subsequently reacted with ultraviolet radiation seals the pores, and/or by deposition of a material that when concomitantly reacted with ultraviolet radiation seals the pores. The UV assisted sealing process advantageously provides a means for integrating porous low k dielectric materials within the integrated circuit manufacturing process. Optionally, after exposure to the ultraviolet radiation, furnace annealing and like processes can be used to anneal the various deposited layers as may be desired for some applications and manufacturing processes. As used herein, the term "porous low k dielectric materials" generally refers to those materials comprising a porous matrix wherein the pore diameters are less than about 2 nanometers (nm) with a resultant dielectric constant (k) less than about 3.0.

Figure 3:
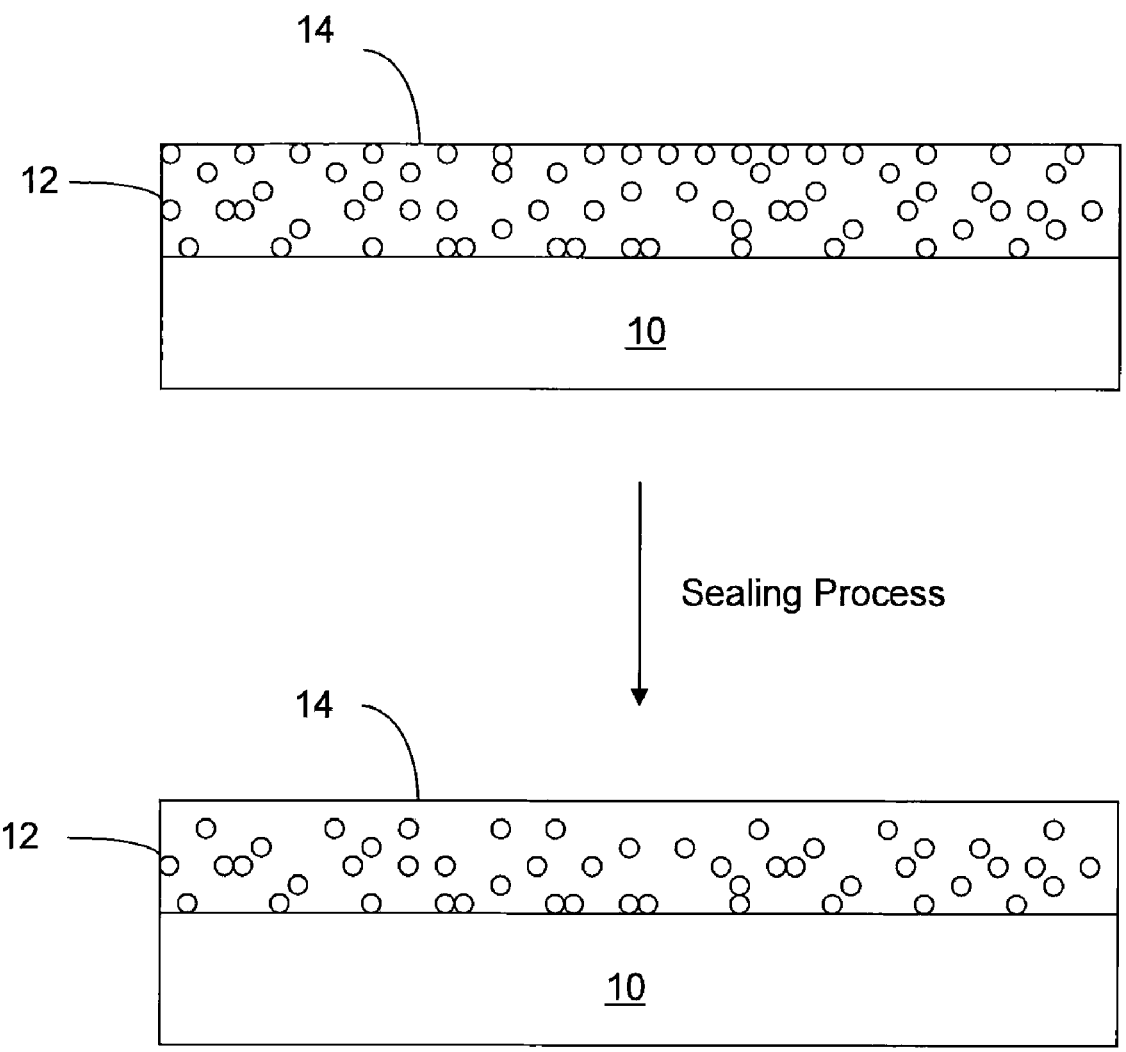
FIG. 3 illustrates a porous dielectric layer after sealing the layer to a depth less than or equal to about 20 nanometers in accordance with the present disclosure.

The process for forming advanced electrical interconnect structures generally comprises forming the porous low k dielectric material onto a substrate and subsequently exposing the surface to an ultraviolet radiation pattern for a time, wavelength, intensity and atmosphere effective to seal the surface of the low k dielectric material or to generate bonding sites for an applied sealing material. In one embodiment, the ultraviolet radiation is effective to seal an exposed surface of the porous low k dielectric material to a depth of 20 nanometers, with a depth of about 10 nanometers more preferred, and a depth equivalent to an average pore diameter even more preferred. Although sealing the dielectric material can exceed 20 nanometers, it is generally less preferred for advanced semiconductor manufacturing since sealing penetration impacts the bulk dielectric behavior of the low k material. FIG. 3 depicts a cross sectional view of a substrate 10 having a porous dielectric layer 12 thereon before and after sealing the surface of the porous dielectric layer in accordance with the present disclosure. As shown, the surface 14 is substantially free of open pores after exposure to the sealing process. It has been found that sealing the porous low k dielectric to at least these depths substantially prevents subsequent damage to the dielectric material upon further processing. As such, process gases and chemistries employed during subsequent processing cannot penetrate the porous structure of the porous low k dielectric material. Moreover, by sealing the porous low k dielectric layer deposition and/or coating of a subsequent layer, e.g., a barrier or diffusion layer, can be made that is substantially free of pinholes since the underlying porous dielectric material includes a surface that is substantially pinhole free, i.e., sealed. In the manufacture of integrated circuits, the diffusion or barrier layer can be important as these layers can be used to form a boundary between the interlayer dielectric and the subsequently deposited conductive material such as copper metal interconnects, for example.

Some examples of processes generally employed by those in the art that may be used to form the porous low k dielectric film include chemical vapor deposition (CVD), plasma enhanced chemical vapor deposition (PECVD), high density PECVD, photon assisted CVD, plasma-photon assisted CVD, cryogenic CVD, chemical assisted vapor deposition, hot-filament CVD, CVD of a liquid polymer precursor, deposition from supercritical fluids, or transport polymerization ("TP"). Other processes that can be used to form the film include spin coating, dip coating, Langmuir-blodgett self-assembly, or misting deposition methods.

As used herein, the term "porous low k dielectric materials" generally refers to those materials comprising a matrix and a porogen, wherein the dielectric material after removal of the porogen has a porous structure. The term "porogen material" generally refers to those sacrificial organic based materials known in the art that generate or form pores within the low k dielectric film after removal thereof. The porogen materials form domains (or discrete regions) in the matrix or matrix precursor, which upon removal form pores in the matrix or matrix precursor. Preferably, the domains should be no larger than the final desired pore size. In the present disclosure, suitable porogen materials are not intended to be limiting and can include those materials that degrade upon exposure to thermal and/or photo radiation to form volatile fragments or radicals, which can be removed from the matrix material or matrix precursor material under a flow of inert gas, for example. In this manner, upon exposure to the radiation, pores are formed within and throughout the matrix, generally extending from a bottom surface to a top surface. As such, the resulting surfaces can comprise numerous pinholes.

Those porogen materials that are generally characterized in the art as thermally labile, thermally removable, photochemically labile, photochemically removable, and the like, are generally suitable for forming porous low k dielectrics. Materials of this kind are generally described in U.S. Pat. No. 6,653,358, entitled, "A Composition Containing a Cross-linkable Matrix Precursor and a Porogen and a Porous Matrix Prepared Therefrom", the contents of which are incorporated herein in their entirety by reference. Exemplary porogen materials generally include, but are not limited to, hydrocarbon materials, labile organic groups, solvents, decomposable polymers, surfactants, dendrimers, hyper-branched polymers, polyoxyalkylene compounds, or combinations thereof.

Suitable matrices and matrix precursors generally include, but are not intended to be limited to silicon-containing polymers, or precursors to such polymers, e.g., silsesquioxanes such as alkyl (preferably lower alkyl, e.g., methyl silsesquioxanes, aryl (e.g., phenyl) or alkyl/aryl silsesquioxanes, and copolymers of silsesquioxanes (e.g., copolymers of polyimides and silsesquioxanes); adamantine based thermosetting compositions; cross-linked polyphenylenes; polyaryl ethers; polystyrenes; crosslinked polyarylenes; polymethylmethacrylates; aromatic polycarbonates; aromatic polyimides; and the like.

For example, suitable silsesquioxanes are polymeric silicate materials of the type (RSiO1.5)n, wherein R is an organic substituent. Combinations of two or more different silicon containing compounds can be used. Other suitable silicon containing compounds for the porous dielectric material generally include materials including silicon, carbon, oxygen and hydrogen atoms, also commonly referred to as SiCOH dielectrics. Exemplary silicon containing compounds include (i) the silsesquioxanes discussed above, (ii) alkoxy silanes, preferably partially condensed alkoxysilanes (e.g., partially condensed by controlled hydrolysis of tetraethoxysilane having an Mn of about 500 to 20,000), (iii) organically modified silicates having the composition $RSiO_3$ and $R_2SiO_2$ wherein R is an organic substituent, and (iv) orthosilicates, preferably partially condensed orthosilicates having the composition $Si(OR)_4$.

Still further, silicon based dielectric precursors may include tetramethylcyclotetrasiloxane, hexamethylcyclotetrasiloxane, octamethylcyclotetrasiloxane, for example.

Another class of matrix precursors include thermosettable benzocyclobutenes (BCBs) or b-staged products thereof. For example, 1,3-bis(2-bicyclo[4.2.0]octa-1,3,5-trien-3-ylethynyl)-1,1,3,3-tetramethyldisiloxane (referred to as DVS-bis-BCB) is a suitable, the b-staged resin of which is commercially available as CYCLOTENE® resin (from The Dow Chemical Company).

Another class of matrix materials include polyarylenes. Polyarylenes, as used herein, include compounds that have backbones made from repeating arylene units and compounds that have arylene units together with other linking units in the backbone, e.g., oxygen in a polyarylene ether. Examples of commercially available polyarylene compositions include SiLK® dielectrics commercially available from The Dow Chemical Company, Flare® dielectric commercially available from Allied Signal, Inc., and Velox® which are poly(arylene ethers commercially available from Air-Products/Shumacher). One class of polyarylene matrix precursors is thermosettable mixtures or b-staged products of a polycyclopentadienone and a polyacetylene. Examples of the thermosetting compositions or cross-linkable polyarylenes that may be used in the composition include monomers such as aromatic compounds substituted with ethynylic groups ortho to one another on the aromatic ring; cyclopentadienone functional compounds combined with aromatic acetylene compounds; and polyarylene ethers. More preferably, the thermosetting compositions comprise the partially polymerized reaction products (i.e., b-staged oligomers) of the monomers mentioned above.

When the matrix precursor comprises a thermosettable mixture or b-staged product of a polycyclopentadienone and a polyacetylene, the precursors are generally characterized so that branching occurs relatively early during the curing process. Formation of a branched matrix early on in the cure process can minimize the modulus drop of the matrix, and also can help minimize possible pore collapse during the cure process.

Another example of a matrix precursor suitable for the preparation of the porous dielectric material is a thermosettable perfluoroethylene monomer (having a functionality of 3 or more) or a b-staged product thereof, e.g., 1,1,1-tris(4-trifluorovinyloxyphenyl)ethane. The thermosettable perfluoroethylene monomer may also be conveniently copolymerized with a perfluoroethylene monomer having a functionality of two. Another suitable polyarylene matrix precursor is a thermosettable bis-o-diacetylene or b-staged product thereof.

Generally, the concentration of pores in the porous dielectric material is sufficiently high to lower the dielectric constant of the matrix but sufficiently low to allow the matrix to withstand the process steps required in the manufacture of the desired microelectronic device so as to maintain mechanical integrity (for example, an integrated circuit, a multichip module, or a flat panel display device). The density of pores is generally sufficient to lower the dielectric constant of the matrix to less than 3.0, in other embodiments, to less than 2.5 in other embodiments, and to less than 2.0 in still other embodiments. In some embodiments, the concentration of the pores can be at least 5 volume percent, in other embodiments, at least 10 volume percent, and in still other embodiments at least 20 volume percent and generally not more than 70 volume percent, and in yet other embodiments, not than 60 volume percent based on the total volume of the porous matrix.

The average diameter of the pores within the matrix is generally less than about 20 nanometers (nm); with less than 2 nm in some embodiments; with not more than about 1 nm in still other embodiments.

During integrated circuit fabrication, the low k dielectric material containing the porogen material is deposited onto a suitable substrate and exposed to a suitable energy source to remove the porogen and form the porous low k dielectric structure. Suitable substrates include, but are not intended to be limited to, silicon, silicon-on-insulator, silicon germanium, silicon dioxide, glass, silicon nitride, ceramics, aluminum, copper, gallium arsenide, plastics, such as polycarbonate, circuit boards, such as FR-4 and polyimide, hybrid circuit substrates, such as aluminum nitride-alumina, and the like. Such substrates may further include thin films deposited thereon, such films including, but not intended to be limited to, metal nitrides, metal carbides, metal silicides, metal oxides, and mixtures thereof. In a multilayer integrated circuit device, an underlying layer of insulated, planarized circuit lines can also function as a substrate. However, the choice of substrates and devices is limited only by the need for thermal and chemical stability of the substrate.

The UV assisted sealing process can employ a UV radiator tool, which, in one embodiment, can first be purged with nitrogen, helium, or argon to allow the UV radiation to enter the process chamber with minimal spectral absorption, especially for wavelengths less than about 200 nm, for example. The porous dielectric material is positioned within the process chamber, which is then purged separately with a desired process gas or gas mixture, such as $N_2$, $H_2$, Ar, He, Ne, $H_2O$ vapor, $NH_3$, $CO_2$, $O_2$, $C_xH_y$, $C_xF_y$, $C_xH_zF_y$, and mixtures thereof, wherein x is an integer between 1 and 6, y is an integer between 4 and 14, and z is an integer between 1 and 14, may be utilized for different applications. The particular process gas can be selected to selectively promote carbonization, and/or oxidation, and/or film densification by crosslinking and/or formation of chemical reactive sites like Si—OH, for example, during the UV exposure. In this regard, UV sealing can occur without the presence of oxygen, or with oxidizing gases, or with reducing gases, or with gases that specifically promote carbonization, or with gases that promote crosslinking, and like variations.

The UV assisted sealing process can employ a UV radiator tool, which, in one embodiment, can first be purged with nitrogen, helium, or argon to allow the UV radiation to enter the process chamber with minimal spectral absorption, especially for wavelengths less than about 200 nm, for example. The porous dielectric material is positioned within the process chamber, which is then exposed separately to ultraviolet radiation and a desired sealant material, such as hexamethyldisilane (HMDS), trimethyldisilane (TMDS), diethylaminotrisilane (DEATS), trimethylchlorosilane (TCMS), etc., and mixtures thereof. The sealant material may be introduced either before, during or after the ultra-violet light exposure. In this regard, UV sealing can occur without the presence of oxygen, or with oxidizing gases, or with reducing gases, or with gases that specifically promote carbonization, or with gases that promote crosslinking, and like variations.

The UV light source can be microwave driven, arc discharge, dielectric barrier discharge, or electron impact generated. Moreover, UV generating bulbs with different spectral distributions may be selected depending on the application.

The wafer temperature during the UV exposure may be controlled ranging from room temperature to 425° C., optionally by an infrared light source, an optical light source, a hot surface, or the light source itself. The process pressure can be less than, greater than, or equal to atmospheric pressure. Typically, the UV sealed porous dielectric material is UV treated for no more than or about 450 seconds and, more particularly, between about 5 and about 300 seconds. Also, UV treating can be performed at a temperature of about room (ambient) temperature to about 450° C., a process pressure that is less than, greater than, or about equal to atmospheric pressure, a UV power between about 0.1 and about 2,000 milliwatts per square centimeter (mW/cm$^2$), and a UV wavelength spectrum between about 150 and about 400 nm. Optionally, sub-ambient temperatures can also be employed to minimize the extent of surface densification penetration to a depth of less than about 20 nm.

The extent of sealing can be measured by using standard analytical techniques. For example, transmission electron microscopy can be employed as well as FTIR analysis. Also, because the surface properties of the low k dielectric change, changes in water contact angles can be measured to determine the extent of sealing. Still further, changes in wet etching rates and/or plasma etching rates can be monitored to provide an indication of sealing effectiveness and penetration. In this manner, throughput as well as the depth of sealing can be optimized for a particular application.

Advantageously, the UV curing process has been found to improve breakdown voltage behavior and wet etch resistance while minimally affecting the bulk dielectric constant of the sealed porous dielectric material. Moreover, FTIR analysis has shown that minor effects on film silanol content were observed for silicon based dielectric films.

In order that the disclosure may be more readily understood, reference is made to the following examples, which are intended to illustrate the invention, but not limit the scope thereof.

EXAMPLES

Example 1

Figure 1:
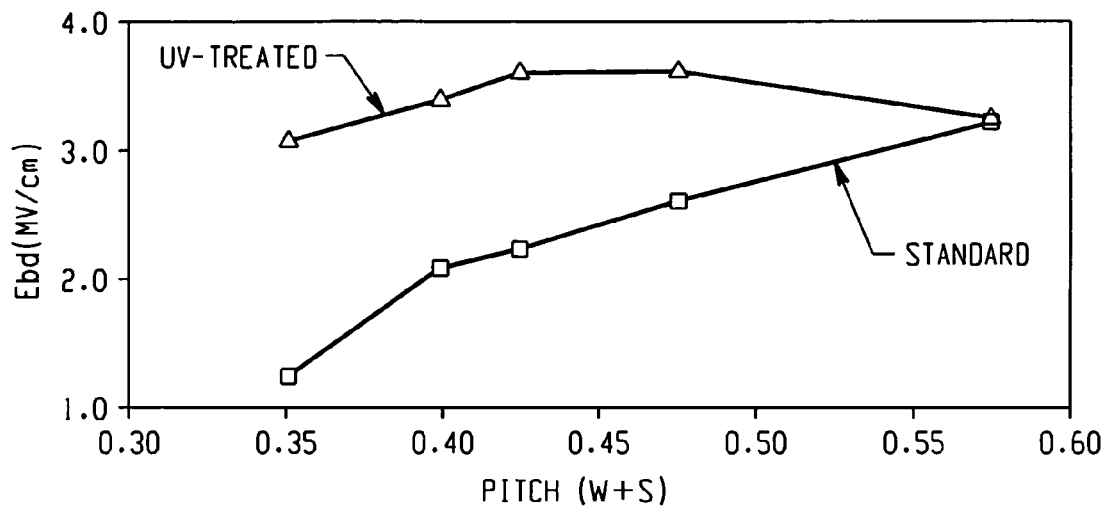
FIG. 1 graphically illustrates breakdown voltage as a function of pitch for a circuit including a porous low k dielectric layer before and after UV treatment in accordance with the present disclosure.

In this Example, breakdown voltage as a function of pitch was measured before and after UV sealing the patterned porous dielectric material in accordance with the present disclosure. Both substrates were annealed. The line width was 175 microns. As shown in the FIG. 1, a significant improvement in the breakdown field was observed for the dense array.

Example 2

Figure 2:
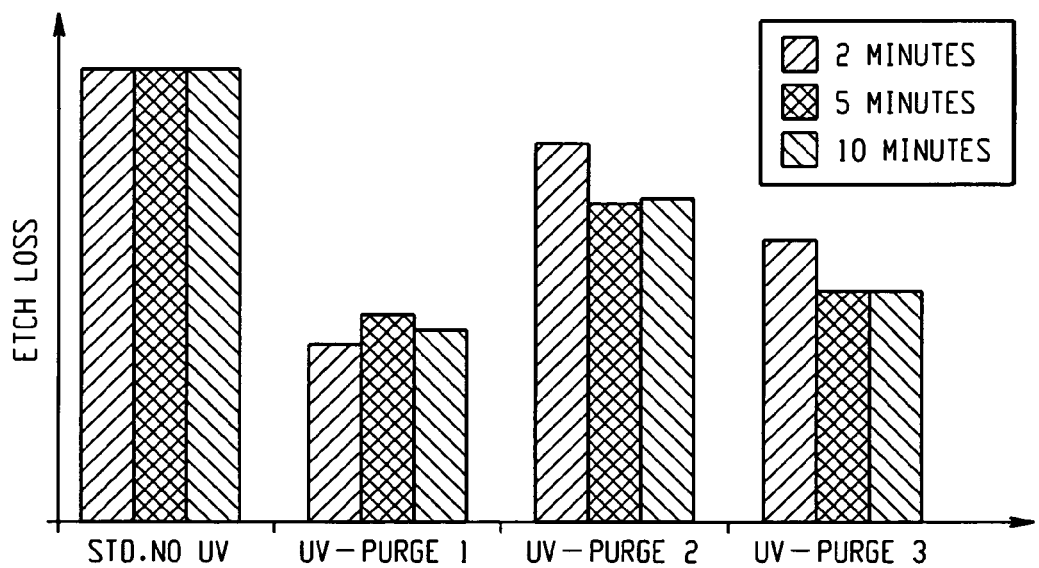
FIG. 2 illustrates relative loss of porous dielectric material after exposure to a hydrofluoric acid wet etching process as a function of time, wherein some of the substrates with the porous dielectric material deposited thereon were exposed to UV radiation in accordance with the present disclosure in different environments.

In this Example, substrates having deposited thereon a porous dielectric material were exposed to a dilute hydrofluoric acid wet etching process for different periods of time. The substrates were exposed to UV radiation in accordance with the present disclosure in an inert environment (purge-1), a reducing environment (purge-2), or an oxidizing environment (purge-3). A control was exposed to the wet etch process without any exposure to UV. The results are shown in FIG. 2, which clearly show an increase in wet etch resistance upon exposure to the UV radiation as well as a dependence on the environment in which the UV exposure occurred.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A process for sealing a surface of an interlayer dielectric comprising a porous low k dielectric material disposed on a substrate, comprising:
   forming and patterning the interlayer dielectric comprising the porous low k dielectric material; and
   subsequently exposing the porous low k dielectric material to an ultraviolet radiation pattern for a period of time, intensity, and wavelength effective to seal the surface of the interlayer dielectric to a depth less than or equal to about 20 nanometers prior to depositing additional layers and/or prior to further processing, wherein the surface is substantially free of open pores and the porous low k dielectric material has a dielectric constant less than 4.

2. The process of claim 1, wherein the ultraviolet radiation pattern comprises broadband wavelengths less than 400 nanometers.

3. The process of claim 1, wherein the ultraviolet radiation pattern comprises broadband wavelengths between about 100 and 400 nanometers.

4. The process of claim 1, wherein exposing the surface of the porous low k dielectric material to the ultraviolet radiation pattern for a period of time, intensity and wavelength is in a reactive purge environment.

5. The process of claim 1, wherein exposing the surface of the porous low k dielectric material to the ultraviolet radiation pattern is in an atmosphere of $N_2$, $H_2$, Ar, He, Ne, $H_2O$ vapor, $NH_3$, CO, $CO_2$, $O_2$, $O_3$, $C_xH_y$, $C_xF_y$, $C_xH_zF_y$, and mixtures thereof, wherein x is an integer between 1 and 6, y is an integer between 4 and 14, and z is an integer between 1 and 14.

6. The process of claim 1, wherein exposing the porous low k dielectric material the ultraviolet radiation pattern is for a period of time, intensity, and wavelength effective to seal a surface of the porous low k material to a depth less than or equal to about 10 nanometers.

7. The process of claim 1, wherein exposing the porous low k dielectric material the ultraviolet radiation pattern is for a period of time, intensity and wavelength effective to seal a surface of the porous low k material to a depth about equal to an average pore diameter.

8. A process for forming an electrical interconnect structure, comprising:

protecting an interlayer dielectric comprising a porous low k dielectric material disposed on a substrate;

exposing the porous low k dielectric film subsequent to patterning to ultraviolet radiation for a period of time, intensity, and wavelength pattern effective to seal the surface of the interlayer dielectric to a depth less than or equal to about 20 nanometers prior to depositing additional layers and/or prior to further processing, wherein the surface is substantially free of open pores and the porous low k dielectric material has a dielectric constant less than 4; and depositing a barrier layer and/or a conductive layer onto the patterned interlayer dielectric, wherein the barrier layer is substantially free of pinholes.

9. The process according to claim 8, further comprising depositing the barrier layer onto the porous low k dielectric material prior to depositing the conductive layer.

10. The process according to claim 8, wherein the ultraviolet radiation comprises broadband wavelengths of less than 400 nanometers.

11. The process according to claim 8, wherein the ultraviolet exposure is performed in an atmosphere of $N_2$, $H_2$, Ar, He, Ne, $H_2O$ vapor, $NH_3$, CO, $CO_2$, $O_2$, $O_3$, $C_xH_y$, $C_xF_y$, $C_xH_zF_y$, and mixtures thereof, wherein x is an integer between 1 and 6, y is an integer between 4 and 14, and z is an integer between 1 and 14.

12. A process for sealing an interlayer dielectric comprising a porous low k dielectric material disposed on a substrate, the process comprising:

forming and patterning the interlayer dielectric comprising the porous low k dielectric material; and subsequently oxidizing a surface of the interlayer dielectric by exposing the porous low k dielectric material to an ultraviolet radiation pattern for a period of time, intensity, and wavelength effective in an atmosphere comprising oxygen to seal the surface of the interlayer dielectric to a depth less than or equal to about 20 nanometers prior to depositing additional layers and/or prior to further processing, wherein the porous low k dielectric material has a dielectric constant less than 4.

13. The process according to claim 12, wherein the ultraviolet radiation pattern comprises broadband wavelengths of less than 400 nanometers.

14. The process according to claim 12, further comprising annealing the porous low k dielectric material after exposing the porous low k dielectric material to the ultraviolet radiation.

15. A process for sealing an interlayer dielectric comprising a porous low k dielectric material disposed on a substrate, the process comprising:

forming and patterning the interlayer dielectric comprising the porous low k dielectric material; and subsequently carbonizing a surface of the interlayer dielectric by exposing the porous low k dielectric material to an ultraviolet radiation pattern for a period of time, intensity and wavelength effective to seal the surface of the interlayer dielectric to a depth less than or equal to about 20 nanometers prior to depositing additional layers and/or prior to further processing, wherein the porous low k dielectric material has a dielectric constant less than 4.

16. The process according to claim 15, wherein the ultraviolet radiation comprises broadband wavelengths of less than 400 nanometers.

17. The process according to claim 15, further comprising annealing the porous low k dielectric material after exposing the porous low k dielectric material to the ultraviolet radiation.

18. A process for sealing an interlayer dielectric comprising a porous low k dielectric material disposed on a substrate, the process comprising:

forming and patterning the interlayer dielectric comprising the porous low k dielectric material; and subsequently densifying a surface of the interlayer dielectric by exposing the porous low k dielectric material to an ultraviolet radiation pattern for a period of time, intensity, and wavelength effective to seal the surface of the interlayer dielectric to a depth less than or equal to about 20 nanometers prior to depositing additional layers and/or prior to further processing, wherein the porous low k dielectric material has a dielectric constant less than 4.

19. The process according to claim 18, wherein the ultraviolet radiation comprises broadband wavelengths of less than 400 nanometers.

20. The process according to claim 19, further comprising annealing the porous low k dielectric material after exposing the porous low k dielectric material to the ultraviolet radiation.

* * * * *